US012720859B2

(12) United States Patent
Karpov et al.

(10) Patent No.: US 12,720,859 B2
(45) Date of Patent: Aug. 25, 2026

(54) FABRICATION OF RECONFIGURABLE ARCHITECTURES USING FERROELECTRICS

(71) Applicant: Intel Corporation, Santa Clara, CA (US)

(72) Inventors: Elijah V. Karpov, Portland, OR (US); Sou-Chi Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 17/957,836

(22) Filed: Sep. 30, 2022

(65) Prior Publication Data

US 2024/0113123 A1 Apr. 4, 2024

(51) Int. Cl.
*H10D 84/90* (2025.01)

(52) U.S. Cl.
CPC ......... *H10D 84/907* (2025.01); *H10D 84/938* (2025.01)

(58) Field of Classification Search
None
See application file for complete search history.

(56) References Cited

U.S. PATENT DOCUMENTS

| | | | | |
|---|---|---|---|---|
| 5,898,317 A * | 4/1999 | Gardner | H03K 19/1776 | 326/38 |
| 6,924,663 B2 * | 8/2005 | Masui | H03K 19/17752 | 326/38 |
| 2020/0098737 A1 * | 3/2020 | Sharma | H03K 19/17736 | |

* cited by examiner

*Primary Examiner* — Jany Richardson
(74) *Attorney, Agent, or Firm* — Essential Patents Group, LLP

(57) ABSTRACT

An apparatus is provided which comprises: a plurality of logic blocks comprising transistors on a substrate, the logic blocks to implement logic functions; a plurality of input/output (I/O) blocks connecting the logic blocks with components external to the apparatus; a plurality of interconnect layers comprising wires and vias surrounded by interlayer dielectric above the substrate, the wires and vias conductively coupling the plurality of logic blocks and the plurality of I/O blocks; a plurality of programmable switches to configure connections between the plurality of logic blocks and the plurality of I/O blocks; and a ferroelectric material in a capacitor coupled to the gate or on the gate dielectric itself of one or more of the transistors. Other embodiments are also disclosed and claimed.

21 Claims, 13 Drawing Sheets

212
214
216
216
246
214
244
210
234
218
230
232
236
242
216
240
238
214
218
222
218
208
220
220
224
224
228
226
228
226
228
204
206
202

FABRICATION OF RECONFIGURABLE ARCHITECTURES USING FERROELECTRICS

BACKGROUND

In reconfigurable architectures, such as field programmable gate arrays (FPGA's), power gates, and other reconfigurable interconnects, for example, an increased density in transistors, such as metal oxide semiconductor field effect transistors (MOSFET's) requires more and more layers of interconnect. These longer connection paths to and from transistors can have a negative impact on resistance and speed, as well as power and noise. The vast majority of area within FPGA's is dedicated to programmable interconnects and the requisite configuration memory associated therewith. As such, there is a need for solutions to improve switching signal quality in reconfigurable architectures to ensure functionality as densities continue to increase.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
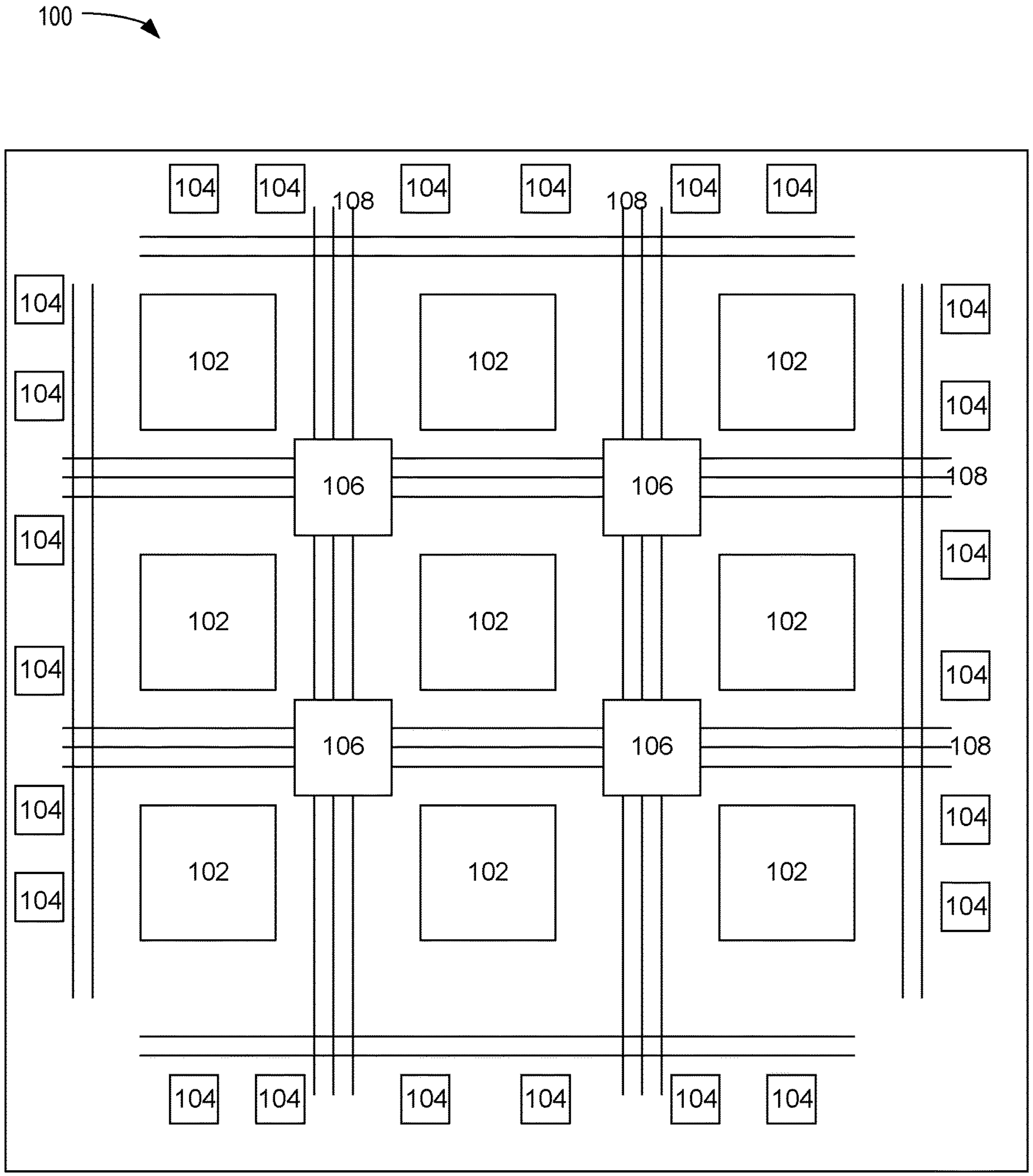
FIG. 1 illustrates an example integrated circuit device suitable for implementing a reconfigurable architecture using ferroelectrics, according to some embodiments.

Fabrication of reconfigurable architectures using ferroelectrics is generally presented. In this regard, embodiments of the present disclosure may enable more reliable reconfigurable interconnects. The efficiency that results from adding ferroelectric material may allow for the removal of some transistors associated with switching cells and thereby free up valuable silicon space. One skilled in the art would appreciate that this approach may enable denser, more highly integrated semiconductor devices.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates an example integrated circuit device suitable for implementing a reconfigurable architecture using ferroelectrics, according to some embodiments. As shown, integrated circuit device 100 includes logic blocks 102, input/output (I/O) blocks 104, switch blocks 106, and interconnects 108. In some embodiments, integrated circuit device 100 may represent a field programmable gate array (FPGA). While shown as being a symmetrical array type of FPGA, with logic blocks arranged in rows and columns of a matrix and interconnect resources between them, in other embodiments integrated circuit device 100 may have a row based architecture, with alternating rows of programmable interconnect resources with rows of logic blocks, or may be hierarchical programmable logic device (PLD) type of FPGA, designed in hierarchical manner with a top level containing only logic blocks and interconnects, where each logic block contains a number of logic modules, and each logic module has combinatorial as well as sequential functional elements.

Logic blocks 102, which may be referred to a logic array blocks or configurable logic blocks, may consist of a few logical cells. In some embodiments, a cell consists of a 4-input look up table (LUT), a full adder (FA) and a D-type flip-flop. In some embodiments, these may be split into two 3-input LUTs that may selectively be combined into a 4-input LUT through a first multiplexer (mux), or alternatively, their outputs may be fed to the adder depending upon a mode that is programmed into a second mux. In some embodiments, entire or parts of the adder may be stored as functions into the LUTs in order to save space.

I/O blocks 104 may bring signals onto integrated circuit device 100 and send them back off again. I/O blocks 104 may consist of an input buffer and an output buffer with three-state and open collector output controls. In some embodiments, there are pull up resistors on the outputs and pull down resistors that may be used to terminate signals and buses without requiring discrete resistors external to integrated circuit device 100.

Switch blocks 106 may define all possible connections between channels of interconnects 108. In some embodiments, connections in switch blocks 106 are made by programmable switches. In some embodiments a programmable switch may consist of a pass transistor controlled by a static random access memory (SRAM) cell. In some embodiments, switch blocks 106 may represent disjoint, universal, or wilton type switch blocks.

Interconnects 108 represents the programmable routing between logic blocks 102 and may consist of fixed metal tracks running horizontally and vertically. Interconnects 108 may be organized in channels that contain the same number of tracks.

Figure 2:
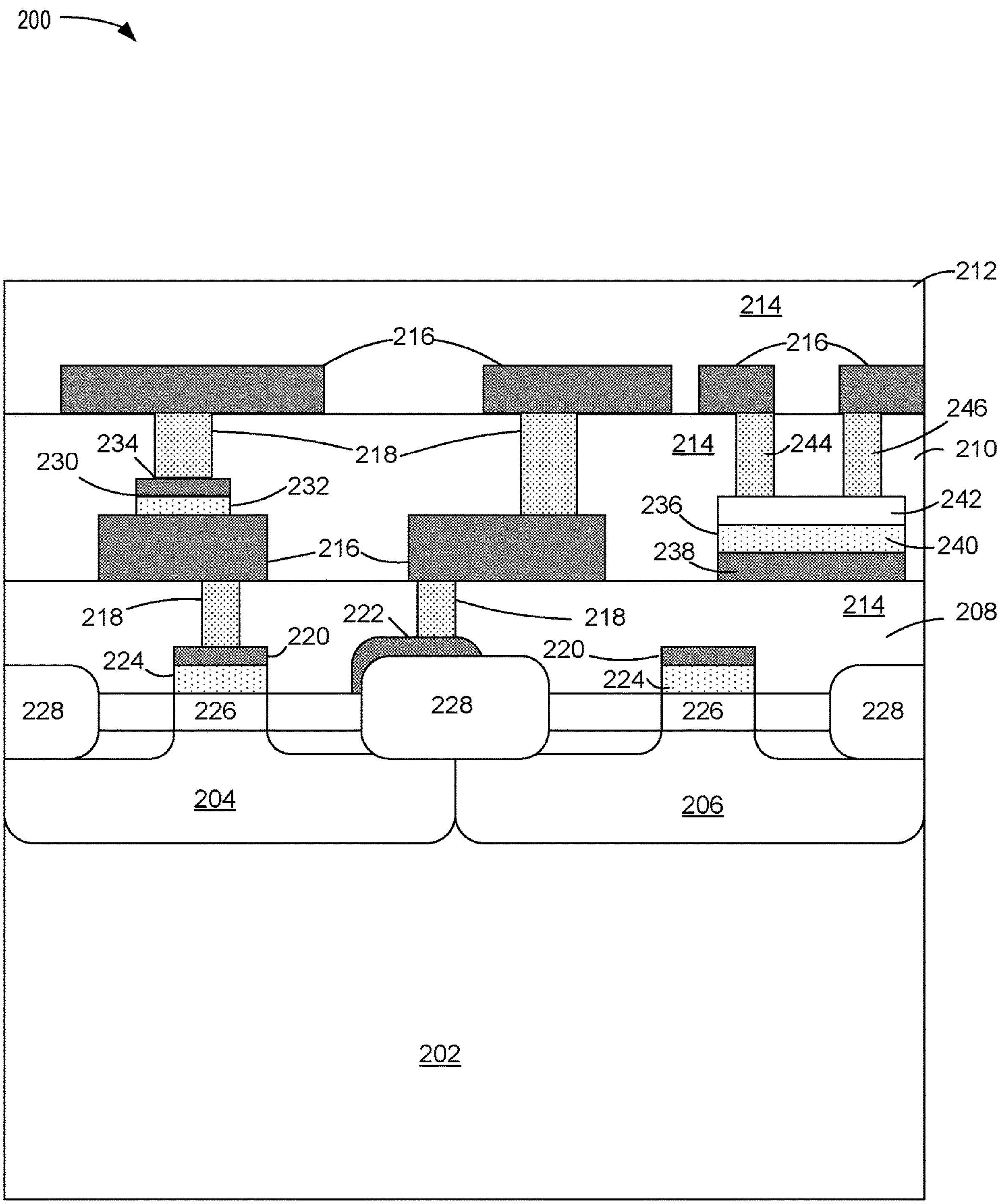
FIG. 2 illustrates an example structure of a reconfigurable architecture using ferroelectrics, according to some embodiments.

FIG. 2 illustrates an example structure of a reconfigurable architecture using ferroelectrics, according to some embodiments. As shown, structure 200 includes semiconductor substrate 202, transistor 204, transistor 206, local interconnect layer 208, semiglobal interconnect layer 210, global interconnect layer 212, interlayer dielectric material 214, interconnects 216, vias 218, gate metals 220, source/drain metal 222, ferroelectric material 224, gate dielectric 226, source/drains 228, ferroelectric capacitor 230, ferroelectric material 232, electrode 234, thin film transistor 236, gate 238, ferroelectric material 240, channel material 242, source 244, and drain 246. While shown as a semiconductor device, structure 200 can also be implemented in substrates other than semiconductor material. For example, structure 200 may be implemented with thin film transistors on a glass substrate. Also, while shown as including ferroelectric devices, in some embodiments only a single ferroelectric device or a quantity of a single type of ferroelectric device is included.

Semiconductor substrate 202 may be silicon or germanium or another semiconductor material with or without dopants. Transistor 204 and transistor 206 may be complementary metal oxide semiconductor (CMOS) transistors, for example, that are integrated into digital circuits of a logic block 102 of integrated circuit device 100.

While shown as having 3 interconnect layers: local interconnect layer 208, semiglobal interconnect layer 210, and global interconnect layer 212, in some embodiments, structure 200 may have ten or more interconnect layers. Local interconnect layer 208 may be the lowest level of interconnect and may include short interconnects at the device level. Semiglobal interconnect layer 210 may be used to connect devices within the same block, such as logic block 102 of integrated circuit device 100. Global interconnect layer 212 represents the upper most level of interconnects and may be used to connect separate blocks of an integrated circuit device.

Interlayer dielectric material 214 provides electrical insulation to interconnects 216 and vias 218. In some embodiments, interlayer dielectric material 214 is a silica-based material, such as silicon oxide ($SiO_2$), carbon doped silicon oxide Interconnects 216 provide electrical connections between components and are typically metal, such as copper. Interconnects 216 may run orthogonally on alternating interconnect layers.

Vias 218 may provide vertical conductive pathways between interconnect layers. Vias 218 may be formed by laser drilling through interlayer dielectric 214 to expose interconnects 216 and then plating or filling the opening with metal.

Gate metals 220 and source/drain metal 222 may represent the lowest level interconnect and may be designed with a slightly higher resistance than interconnects 216 to withstand higher processing temperatures.

Ferroelectric material 224 may represent any material with ferroelectric properties for improved switching. In some embodiments, ferroelectric material 224 is a ferroelectric fluoride, such as a crystalline doped hafnium oxide thin film, for example. Some examples of dopants that may be infused in hafnium oxide include, but are not limited to, aluminum, silicon, or lanthanum. In other embodiments, ferroelectric material 224 is a perovskite ferroelectric. Some examples of perovskite ferroelectric materials, include, but are not limited to, a subgroup of corner sharing oxygen octahedral materials exhibiting $ABO_3$ structure, such as strontium titanate (STO), barium titanate ($BaTiO_3$), lead titanate ($PbTiO_3$), lead zirconate titanate (PZT), barium strontium titanate (BST), or potassium niobate ($KNbO_3$).

In some embodiments, ferroelectric material 224 may have a thickness of about 5 nanometers (nm), however if a ferroelectric material with lower ferroelectric properties is chosen, then ferroelectric material 224 may have a thickness of tens of nm.

Gate dielectric 226 may be formed between ferroelectric material 224 and the substrate of transistors 204 and 206 to provide capacitance. In some embodiments, gate dielectric 226 is silicon dioxide or hafnium oxide (HfO2).

Ferroelectric capacitor 230 may be formed by interconnect 216, ferroelectric material 232, and electrode 234 and may be conductively coupled with gate metal 220 of transistor 204. While shown as being a thin film planar capacitor, ferroelectric capacitor 230 may be any time type of ferroelectric capacitor, including perhaps a vertical or cylinder capacitor. While shown as being present within semiglobal interconnect layer 210, ferroelectric capacitor 230 may be present in any interconnect layer. Ferroelectric material 232 may be a ferroelectric material, such as any of those described above in reference to ferroelectric material 224.

Thin film capacitor 236 may be formed on or in interlayer dielectric material 214 of an interconnect layer. As shown, thin film capacitor 236 may include gate 238, ferroelectric material 240, channel material 242, source 244, and drain 246. In some embodiments, thin film capacitor 236 may function as a power gate to gate power to portions of integrated circuit device 100, such as one or more of logic blocks 102.

In some embodiments, channel material 242 may be any suitable material, such as silicon, indium gallium zinc oxide, cadmium selenide, zinc oxide, or organic material, for example. Channel material 242 may be deposited in any of a variety of techniques, including, but not limited to, chemical vapor deposition, atomic layer deposition, or sputtering, for example. Ferroelectric material 240 may be a ferroelectric material, such as any of those described above in reference to ferroelectric material 224.

Figure 3A:
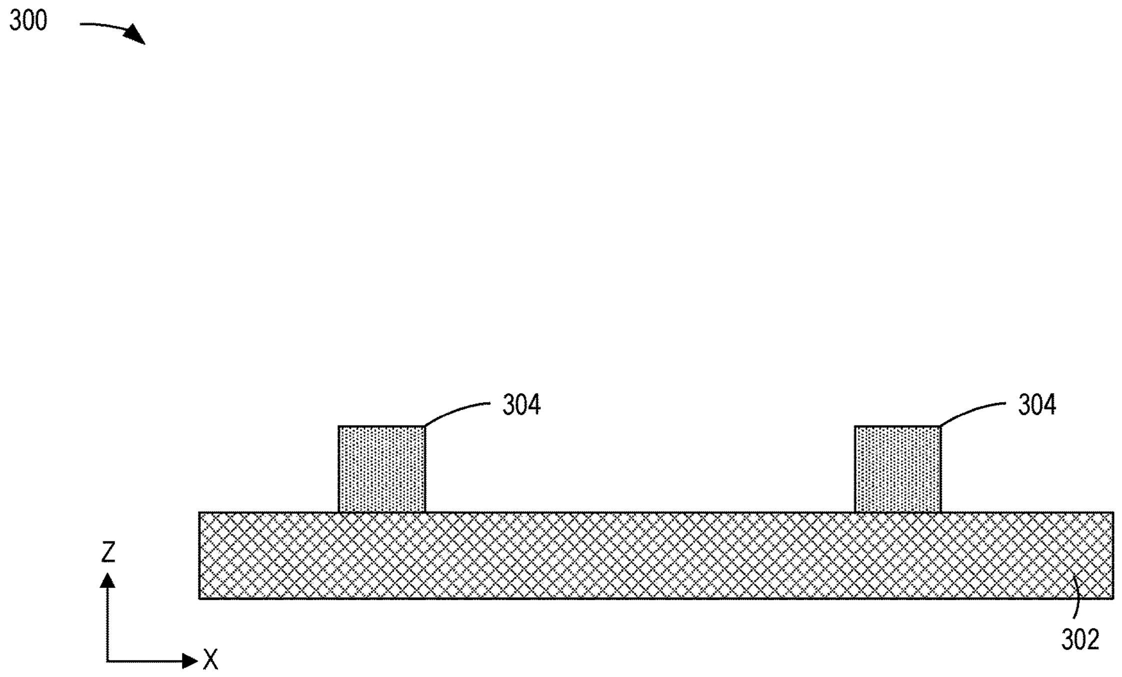
FIGS. 3A & 3B illustrate cross-sectional views of partially formed semiconductor devices for a reconfigurable architecture using ferroelectrics, according to some embodiments.
Figure 3B:
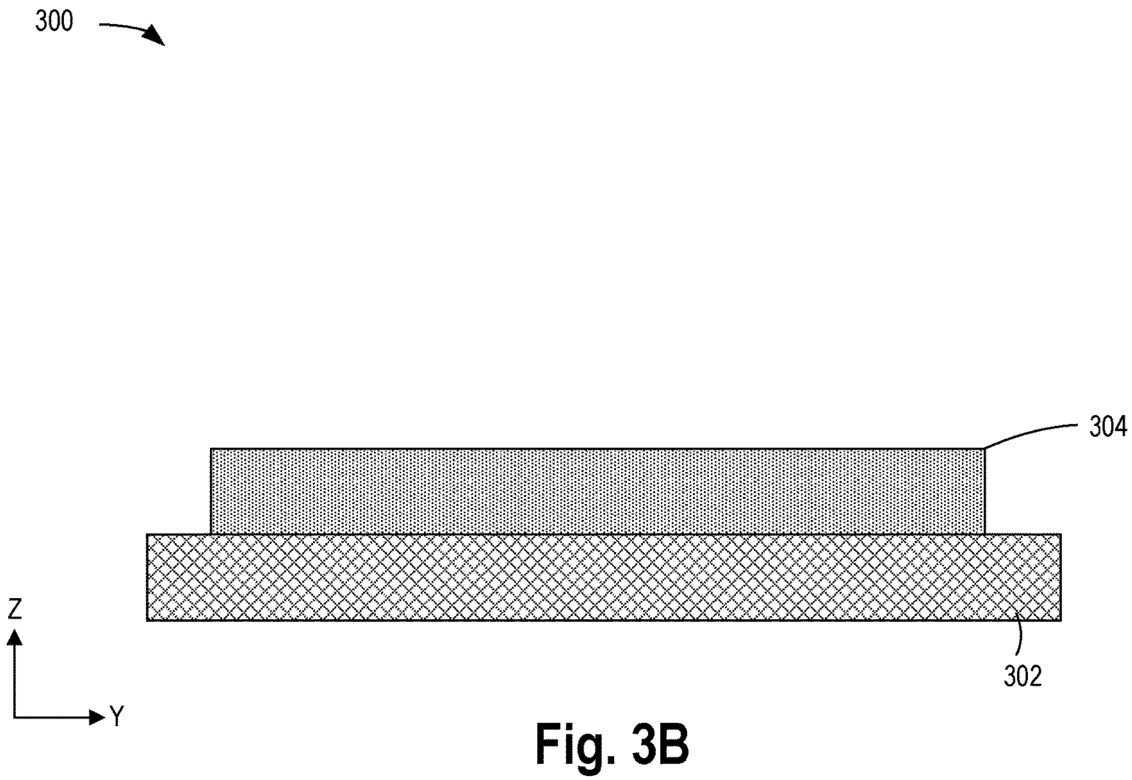

FIGS. 3A & 3B illustrate cross-sectional views of partially formed semiconductor devices for a reconfigurable architecture using ferroelectrics, according to some embodiments. FIGS. 3A & 3B may represent a manufacturing assembly of a semiconductor device as viewed along orthogonal planes. As shown, assembly 300 may include substrate 302 and transistor bodies 304.

In some embodiments, substrate 302 comprises at least one layer of undoped semiconductor, such as Ge, Si, SiGe, InGaAs, AlSb, etc. Substrate 302 may be composed of one or more semiconductor material layers on top of another semiconductor material such as silicon.

Transistor bodies 304 may be semiconductor fins formed by any suitable technique, including, for example, epitaxially growth or regrowth. Transistor bodies 304 may contain any suitable semiconductor material, including, but not limited to, InGaAs, InAs, InGaAs, InGaAsSb, InSb, GaSb, Ge, Si, or SiGe. In some embodiments, transistor bodies 304 may be doped with an n-type dopant, such as phosphorus or arsenic or the like, or transistor bodies 304 may be doped with a p-type dopant, such as boron or the like. In some embodiments, transistor bodies 304 contain n-type semiconductor material. Transistor bodies 304 may include additional n-type dopants in areas that are designed to serve as source/drain regions. Additionally, oxide may be deposited or grown on transistor bodies 304 to serve as a gate dielectric (not shown).

Figure 4A:
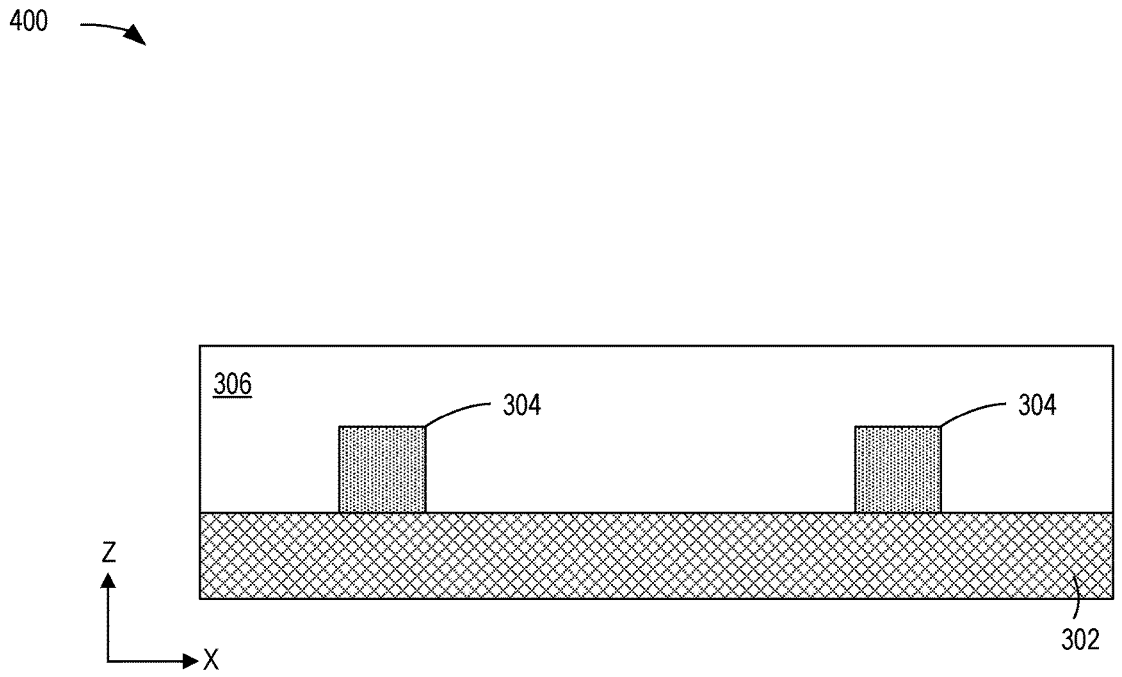
FIGS. 4A & 4B illustrate cross-sectional views of partially formed semiconductor devices for a reconfigurable architecture using ferroelectrics, according to some embodiments.
Figure 4B:
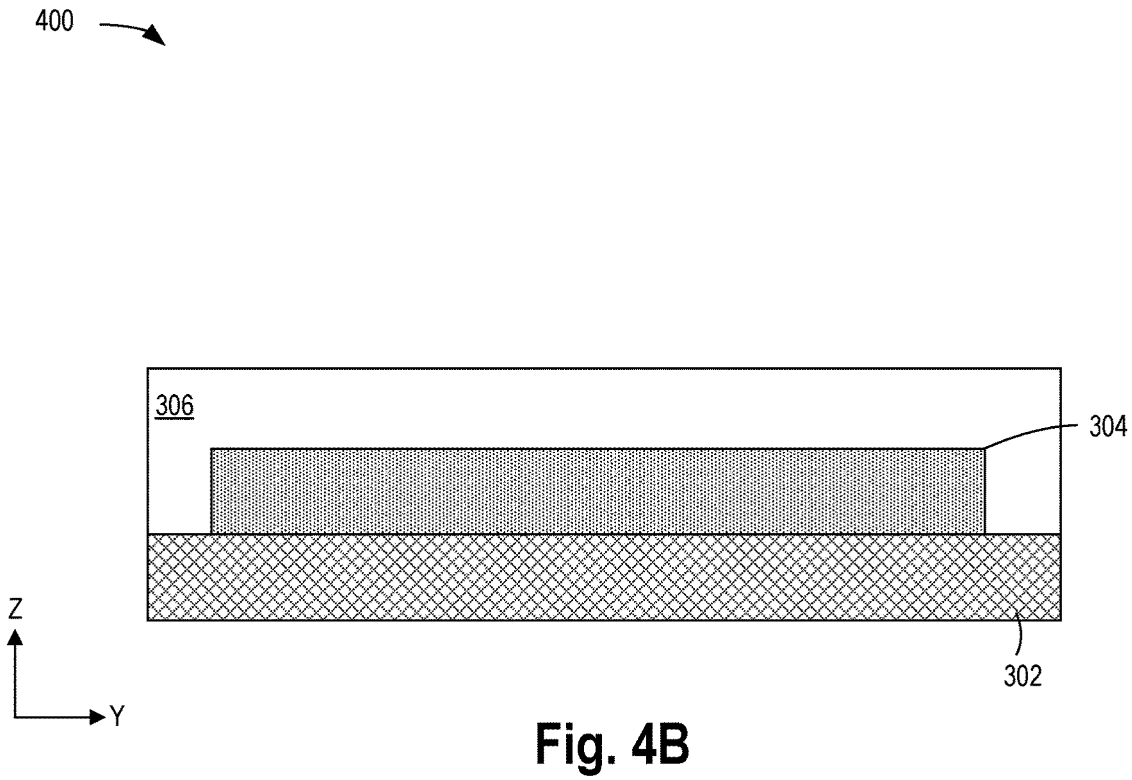

FIGS. 4A & 4B illustrate cross-sectional views of partially formed semiconductor devices for a reconfigurable architecture using ferroelectrics, according to some embodiments. As shown, assembly 400 may represent assembly 300 after further processing steps.

Dielectric 306 may represent an interlayer dielectric, such as, for example, silicon dioxide. In some embodiments, dielectric 306 may be deposited by known deposition techniques, such as atomic layer deposition (ALD).

Figure 5A:
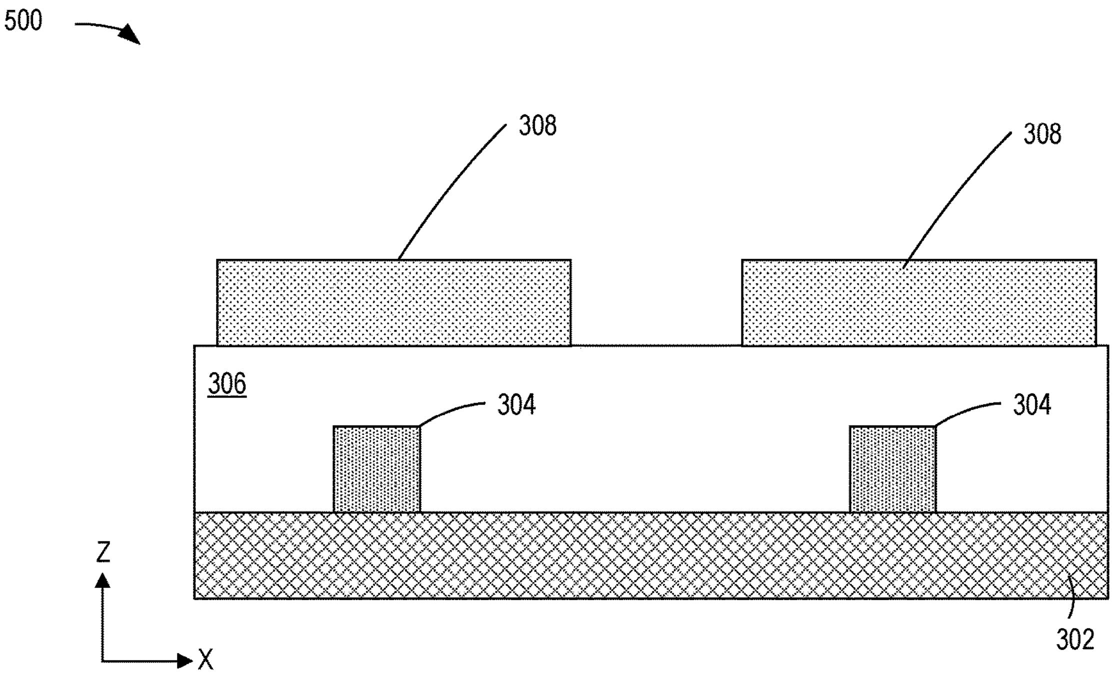
FIGS. 5A & 5B illustrate cross-sectional views of partially formed semiconductor devices for a reconfigurable architecture using ferroelectrics, according to some embodiments.
Figure 5B:
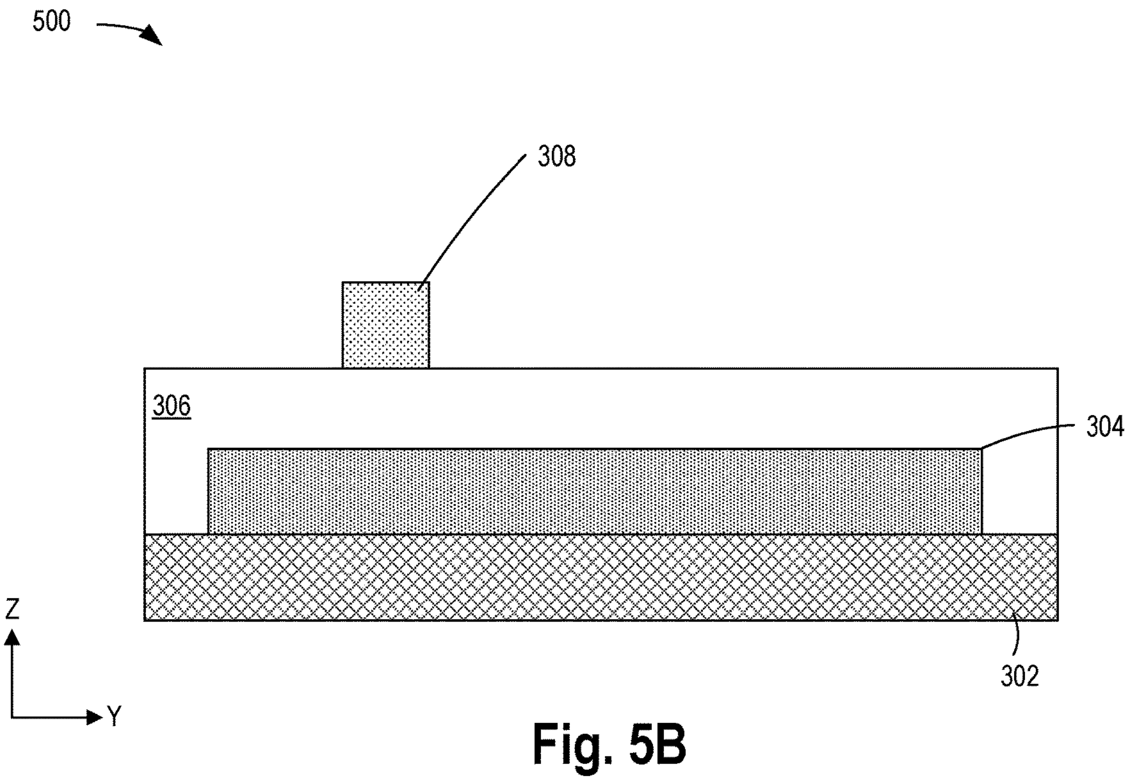

FIGS. 5A & 5B illustrate cross-sectional views of partially formed semiconductor devices for a reconfigurable architecture using ferroelectrics, according to some embodiments. As shown, assembly 500 may represent assembly 400 after further processing steps.

Transistor bodies 308 may be semiconductor fins formed by any suitable technique, including, for example, epitaxially growth or regrowth. In some embodiments, transistor bodies 308 contain p-type semiconductor material. Transistor bodies 308 may include additional p-type dopants in areas that are designed to serve as source/drain regions. Additionally, oxide may be deposited or grown on transistor bodies 308 to serve as a gate dielectric (not shown).

Figure 6A:
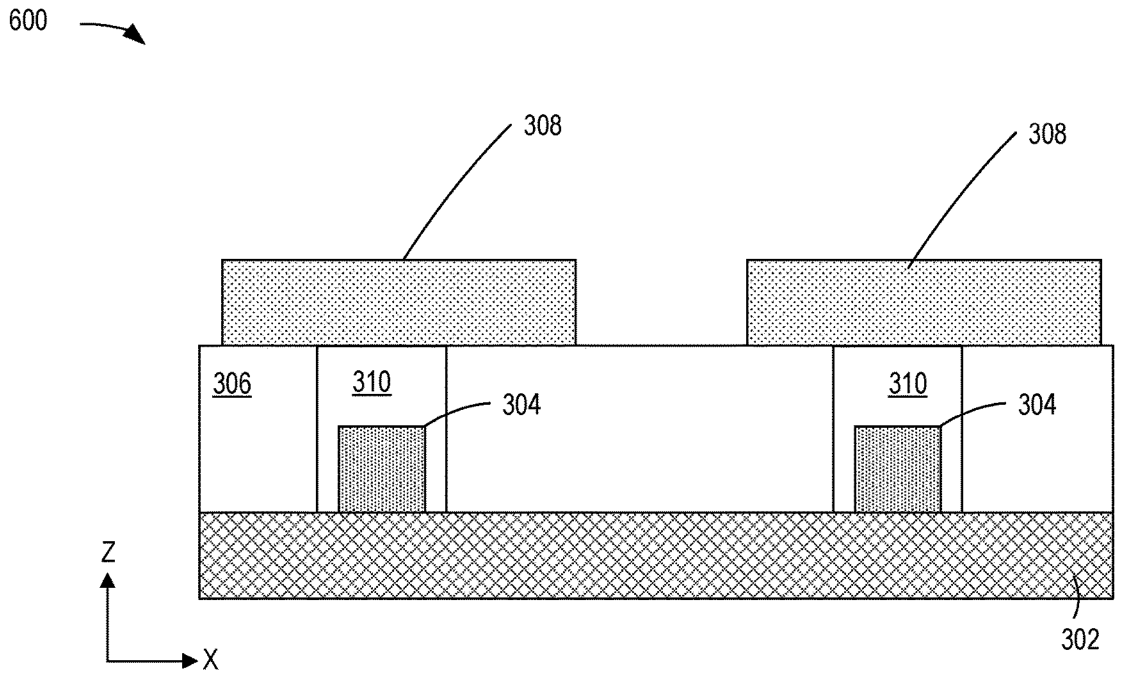
FIGS. 6A & 6B illustrate cross-sectional views of partially formed semiconductor devices for a reconfigurable architecture using ferroelectrics, according to some embodiments.
Figure 6B:
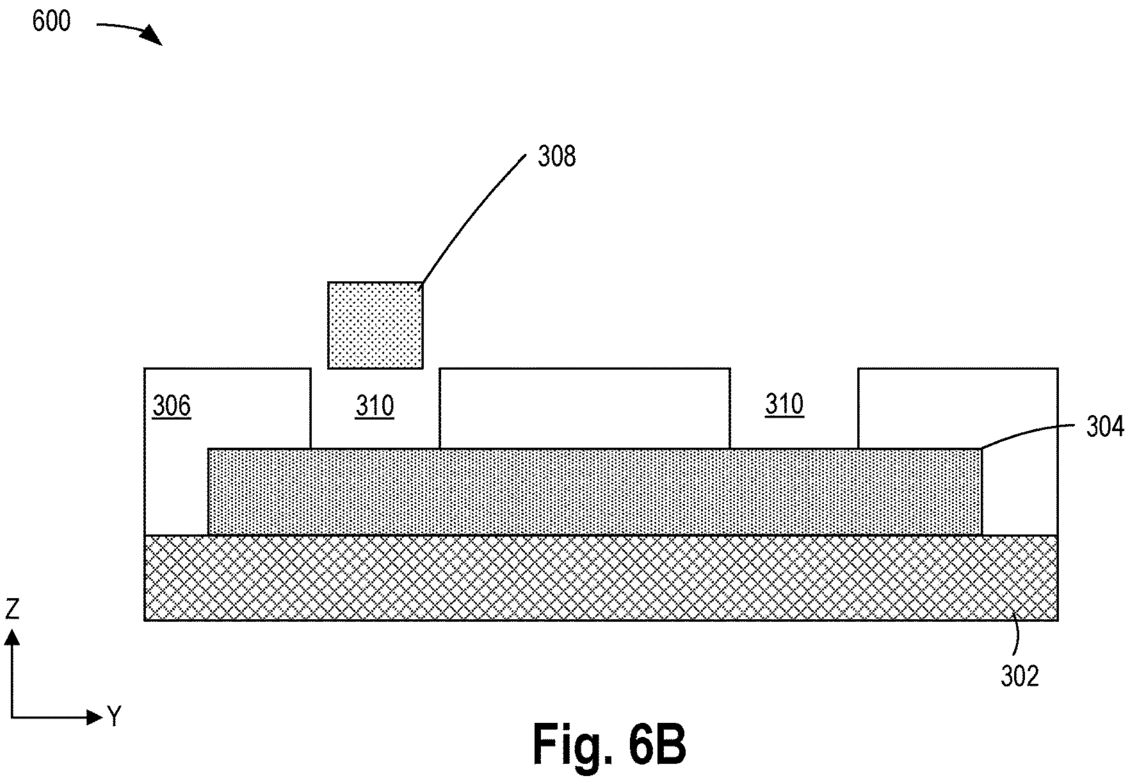

FIGS. 6A & 6B illustrate cross-sectional views of partially formed semiconductor devices for a reconfigurable architecture using ferroelectrics, according to some embodiments. As shown, assembly 600 may represent assembly 500 after further processing steps.

Voids 310 may be formed through dielectric 306 around areas of transistor bodies 304 that are designed to serve as channel regions. Voids 310 may be formed by any suitable technique, including, but not limited to a selective chemical etch that may remove dielectric 306 without removing transistor bodies 304 or 308.

Figure 7A:
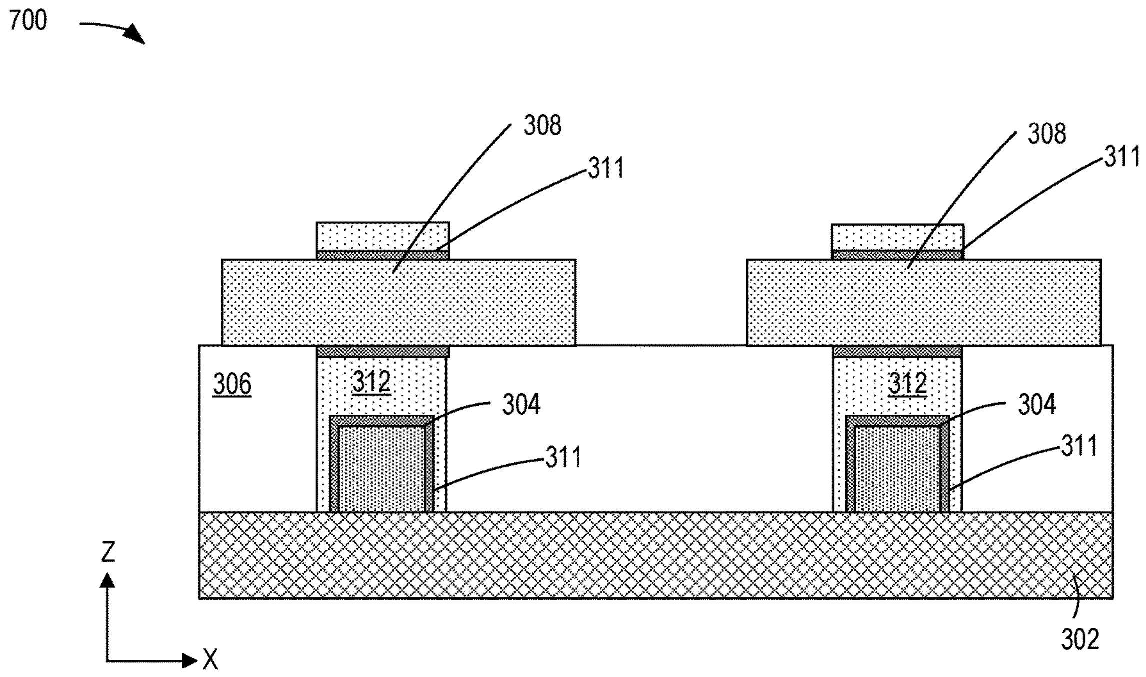
FIGS. 7A & 7B illustrate cross-sectional views of partially formed semiconductor devices for a reconfigurable architecture using ferroelectrics, according to some embodiments.
Figure 7B:
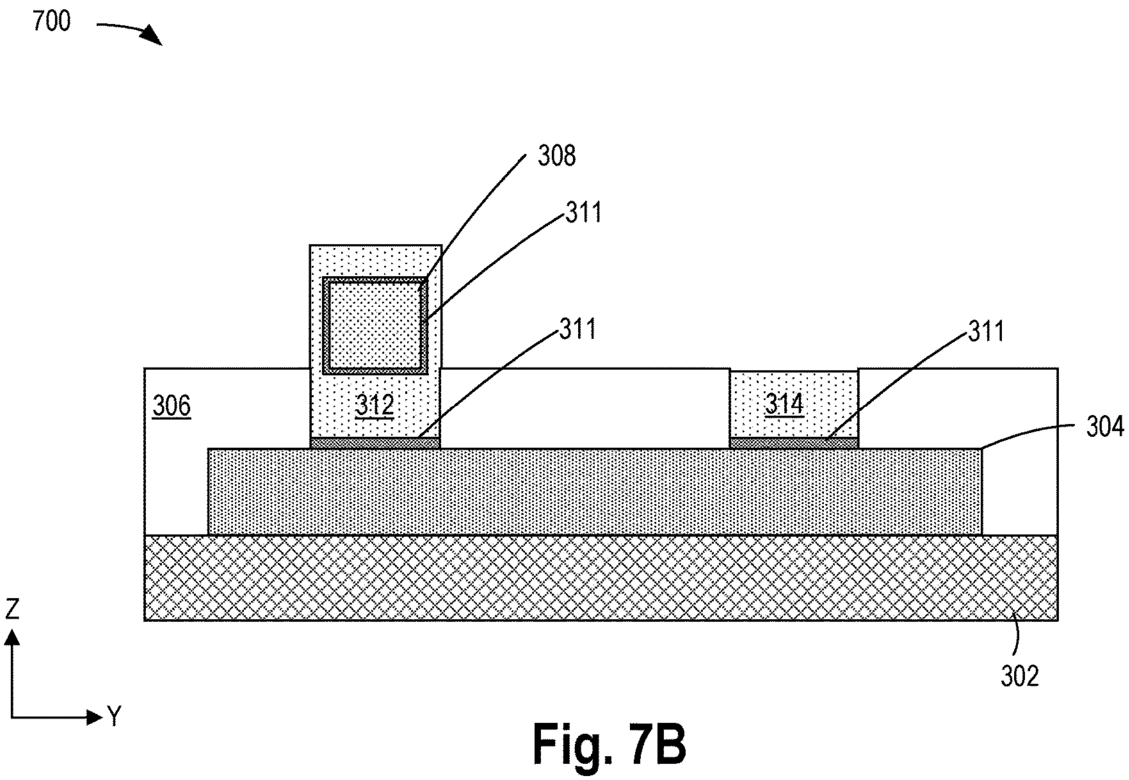

FIGS. 7A & 7B illustrate cross-sectional views of partially formed semiconductor devices for a reconfigurable architecture using ferroelectrics, according to some embodiments. As shown, assembly 700 may represent assembly 600 after further processing steps.

Ferroelectric material 311 may be any ferroelectric material, such as those discussed above in reference to ferroelectric material 224, and may contact gate dielectric previously formed on transistor bodies 304. In some embodiments, ferroelectric material 311 also wraps around, and contacts gate dielectric previously formed on, transistor bodies 308, while in other embodiments ferroelectric material 311 might not fully wrap around transistor bodies 308. Gates 312 and 314 may fill voids 310 with polycrystalline silicon or metal and contact ferroelectric material 311.

Figure 8A:
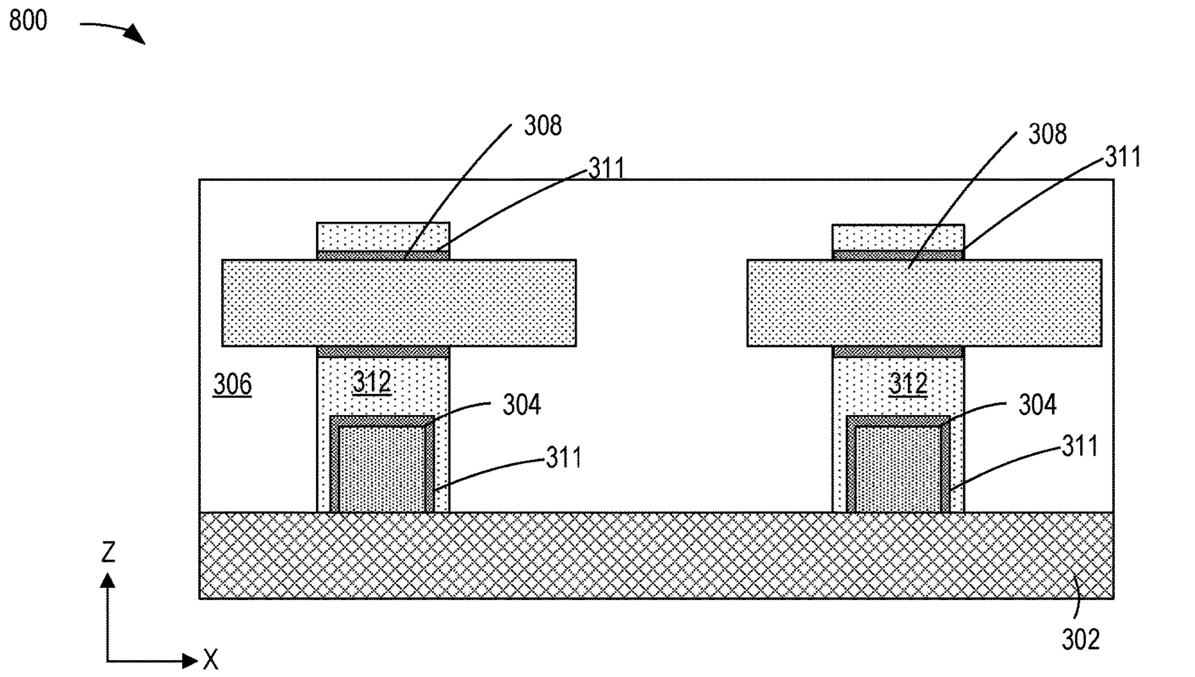
FIGS. 8A & 8B illustrate cross-sectional views of partially formed semiconductor devices for a reconfigurable architecture using ferroelectrics, according to some embodiments.
Figure 8B:
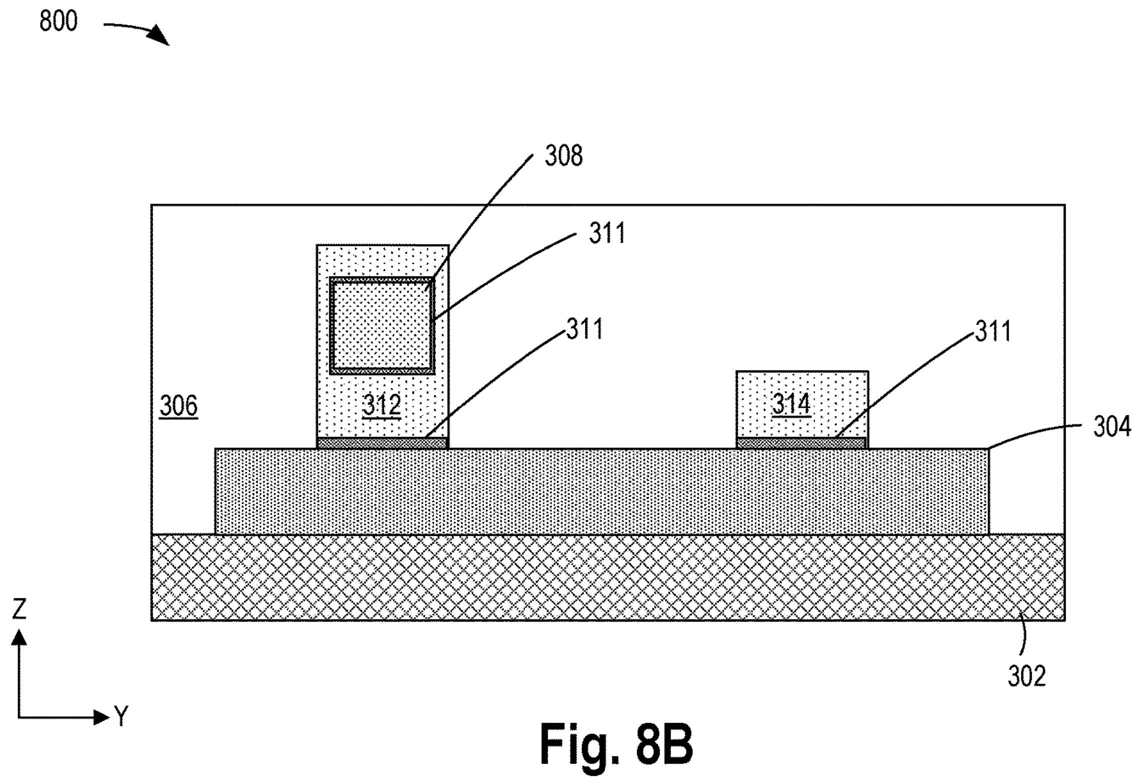

FIGS. 8A & 8B illustrate cross-sectional views of partially formed semiconductor devices for a reconfigurable architecture using ferroelectrics, according to some embodiments. As shown, assembly 800 may represent assembly 700 after further processing steps.

Further dielectric 306 may be deposited to cover transistor bodies 308 and gates 312 and 314. In some embodiments, silicon dioxide may be deposited by any suitable technique, including, but not limited to, ALD.

Figure 9A:
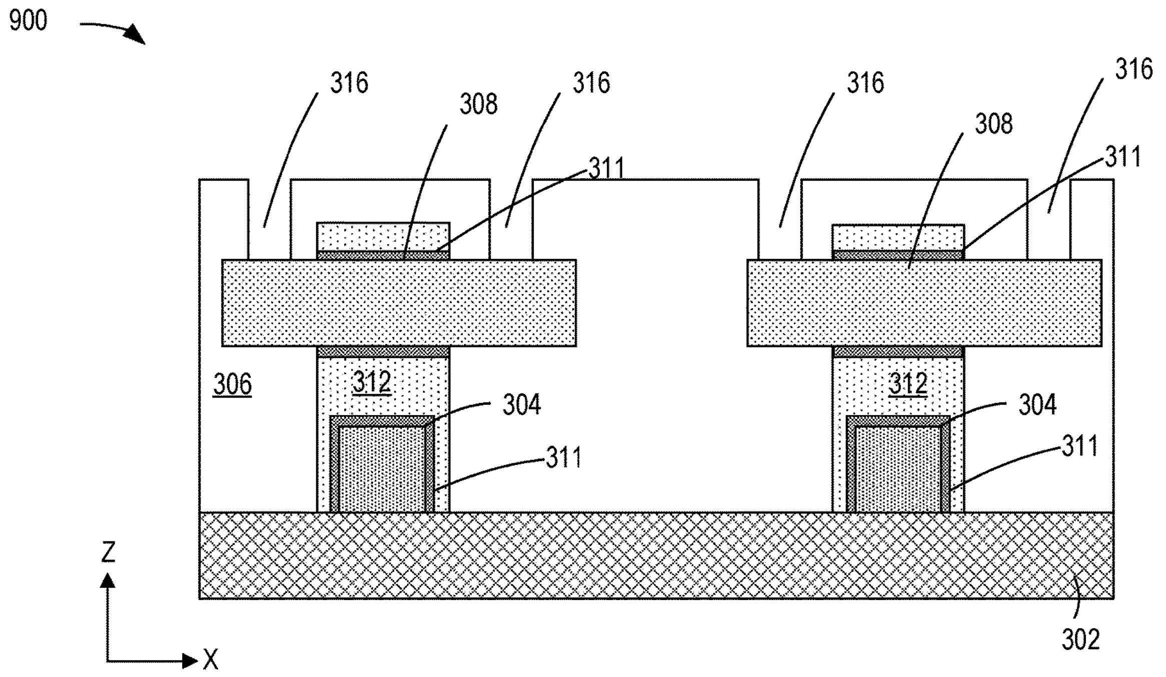
FIGS. 9A & 9B illustrate cross-sectional views of partially formed semiconductor devices for a reconfigurable architecture using ferroelectrics, according to some embodiments.
Figure 9B:
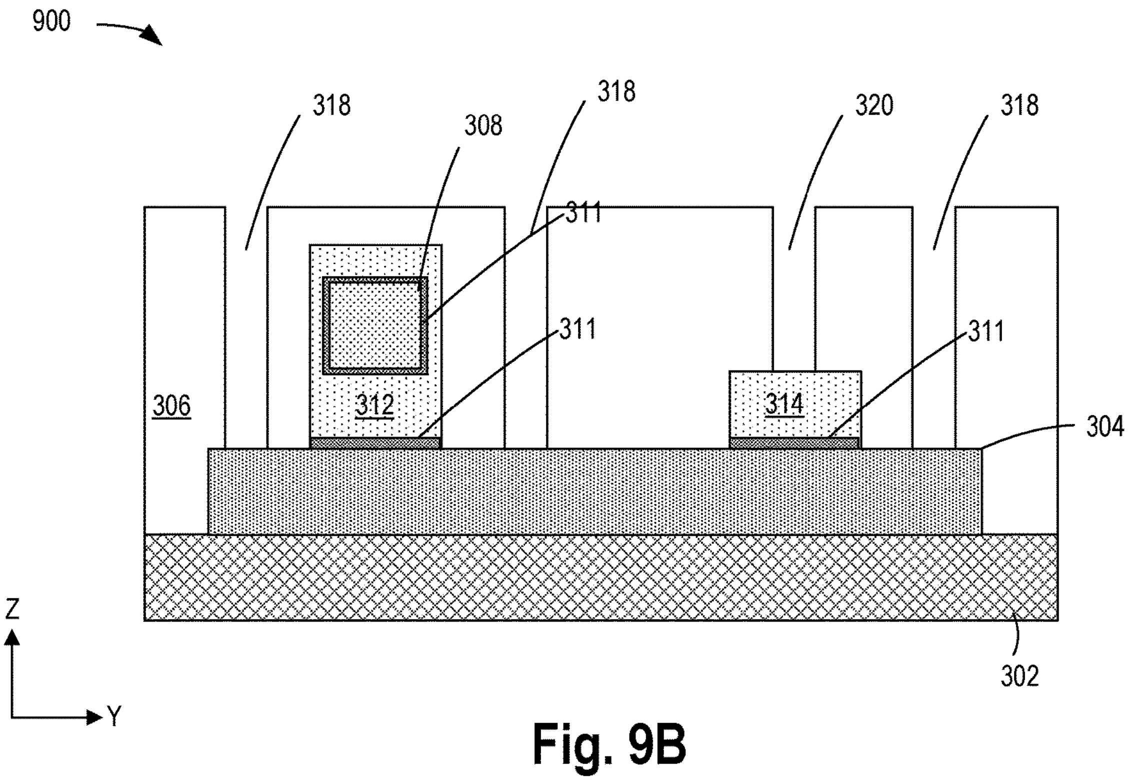

FIGS. 9A & 9B illustrate cross-sectional views of partially formed semiconductor devices for a reconfigurable architecture using ferroelectrics, according to some embodiments. As shown, assembly 900 may represent assembly 800 after further processing steps.

Voids 316, 318, and 320 may be formed in dielectric 306 by any suitable technique, including chemical etching or mechanical drilling. In some embodiments, laser ablation may create voids 316, in locations designed to contact transistor bodies 308, voids 318, in locations designed to contact transistor bodies 304, and voids 320, in locations designed to contact gates 314.

Figure 10A:
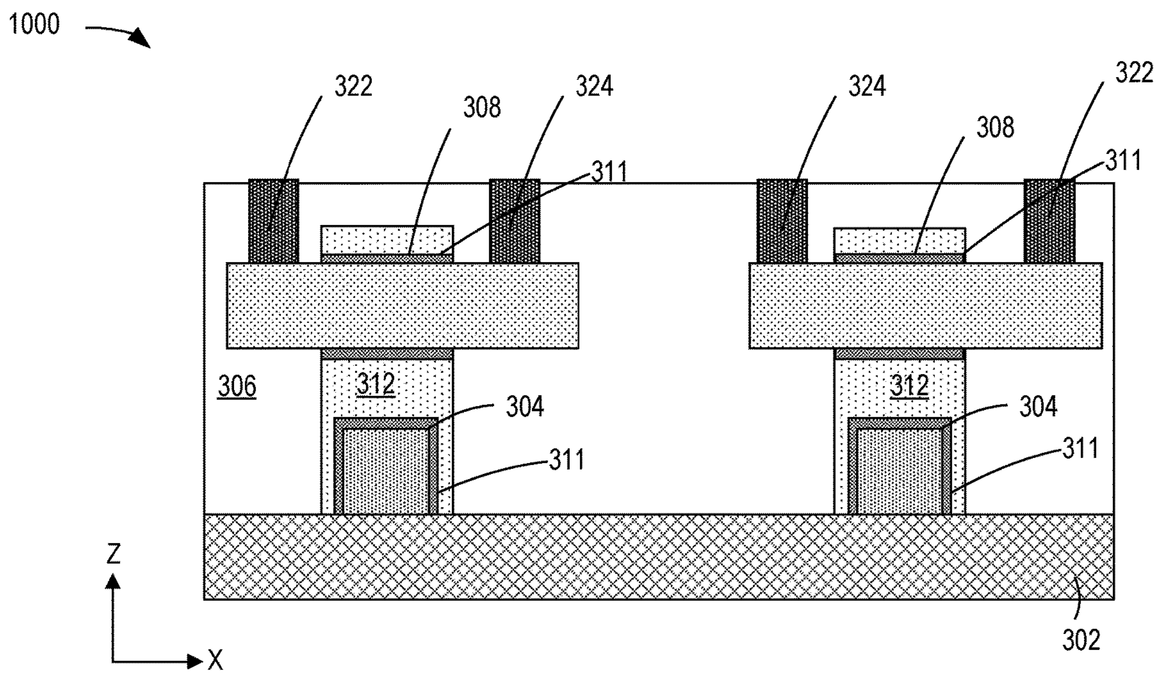
FIGS. 10A & 10B illustrate cross-sectional views of partially formed semiconductor devices for a reconfigurable architecture using ferroelectrics, according to some embodiments.
Figure 10B:
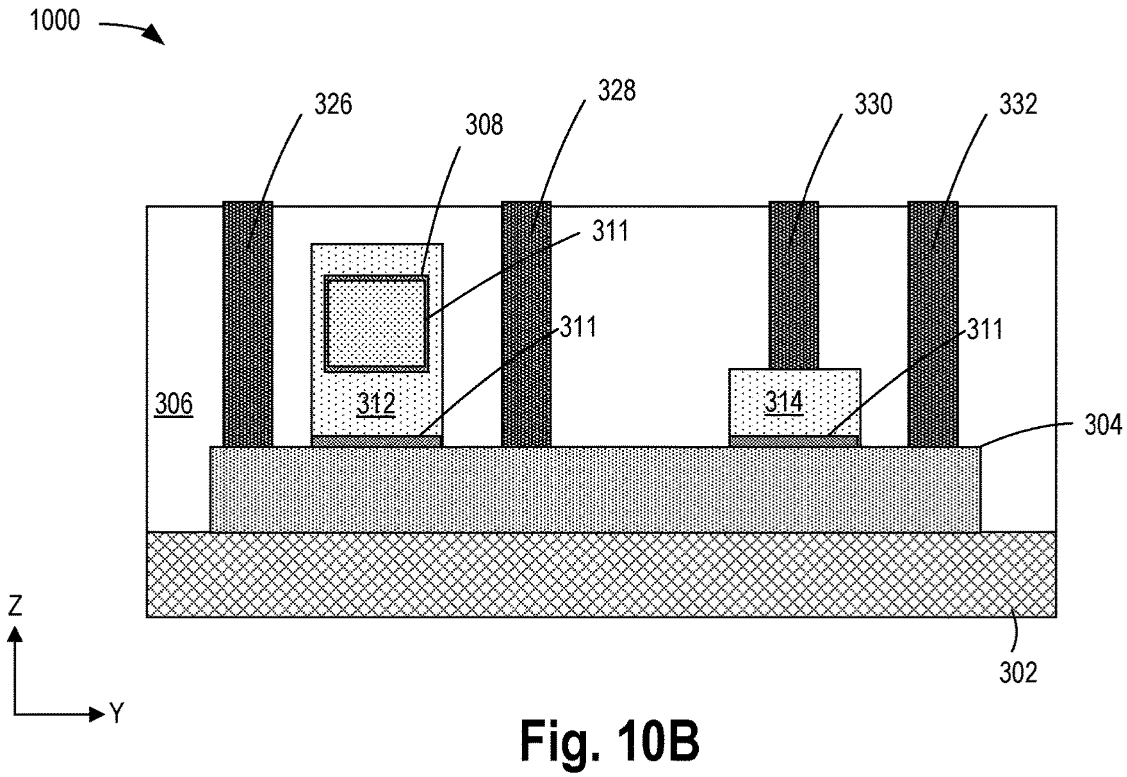

FIGS. 10A & 10B illustrate cross-sectional views of partially formed semiconductor devices for a reconfigurable architecture using ferroelectrics, according to some embodiments. As shown, assembly 1000 may represent assembly 900 after further processing steps.

Voids 316, 318, and 320 may be filled with metal to create conductive contacts that may be coupled with higher level interconnects not shown. In some embodiments, contacts 322 may couple source regions of a pull-up transistor in transistor bodies 308 with a voltage source and contacts 324 may couple drain regions in transistor bodies 308 with an interconnect.

In some embodiments, contacts 326 may couple drain regions of pull-down transistors in transistor bodies 304 with a ground. Contacts 328 may couple both source regions of pull-down transistors and drain regions of access transistors in transistor bodies 304 with an interconnect and contacts 332 may couple source regions of access transistors in transistor bodies 304 with a bit line signal.

In some embodiments, contacts 330 may couple gates 314, which may control an access transistor in transistor bodies 304, with a word line signal. Local, semiglobal, and global interconnect layers may subsequently be formed as part of additional processing steps.

Figure 11:
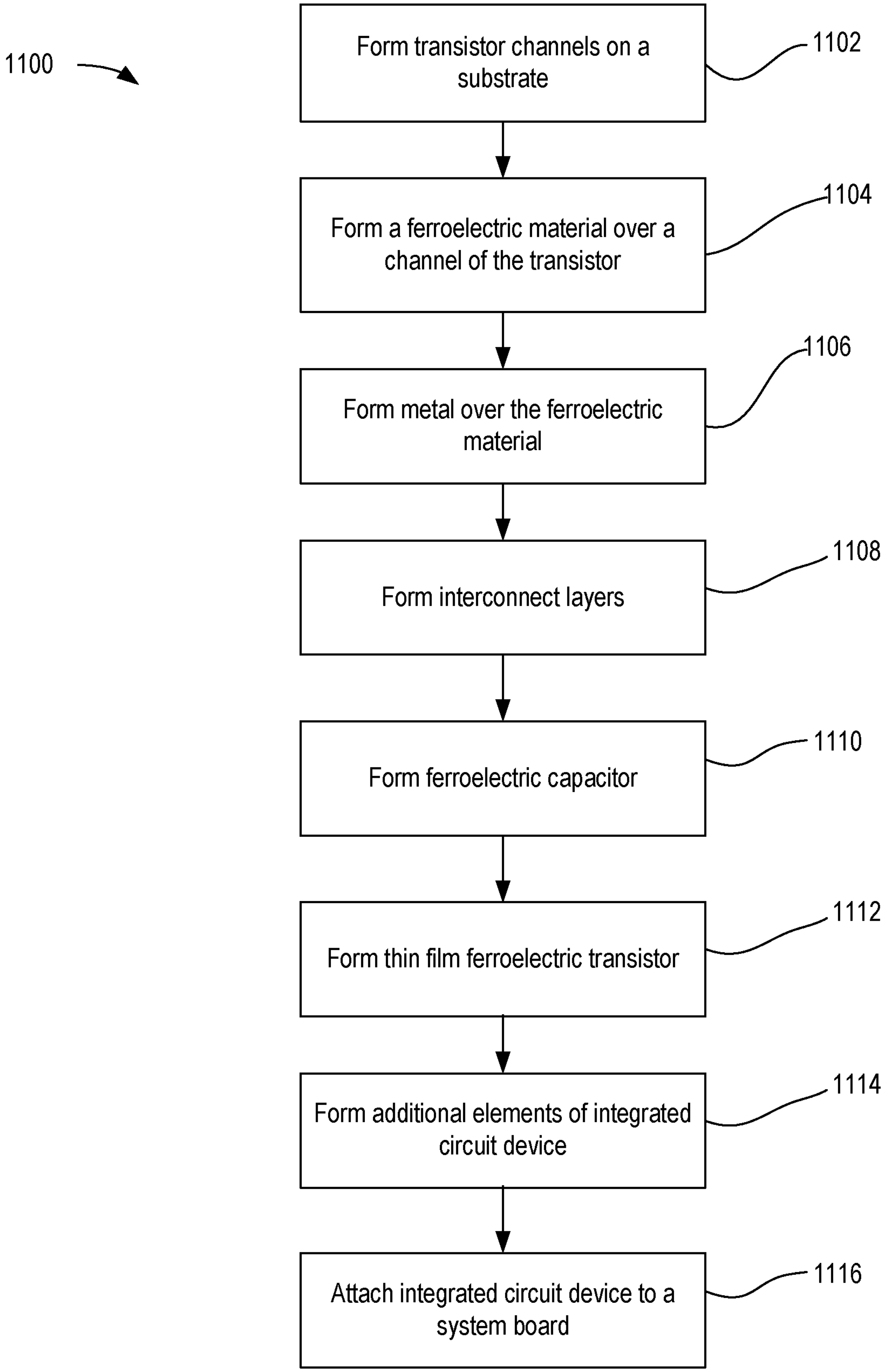
FIG. 11 illustrates a flowchart of a method of fabrication of a reconfigurable architecture using ferroelectrics, in accordance with some embodiments.

FIG. 11 illustrates a flowchart of a method of fabrication of a reconfigurable architecture using ferroelectrics, in accordance with some embodiments. Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 1100 begins with forming (1102) transistor channels on a substrate. In some embodiments, transistor bodies 304 may be epitaxially formed in a trench to create fins. In some embodiments, transistors 204 and 206 may be formed on semiconductor substrate 202. Next, a ferroelectric material is formed (1104) over a channel of the transistor. In some embodiments, ferroelectric material 224 or 311 may be formed over gate dielectric 226 or transistor bodies 304 or 308, respectively.

Then, a metal may be formed (1106) over the ferroelectric material. In some embodiments, gate metal 220 or gates 312 and 314 may be formed over ferroelectric material 224 or 311, respectively. Next, interconnect layers may be formed (1108) over the transistors. In some embodiments, local interconnect layer 208, semiglobal interconnect layer 210, and global interconnect layer 212 are formed over transistors 204 and 206.

The method continues, in some embodiments, with forming (1110) a ferroelectric capacitor. In some embodiments, ferroelectric capacitor 230 may be formed in semiglobal interconnect layer 210 or another interconnect layer. Next, in some embodiments, a thin film transistor may be formed (1112). In some embodiments, thin film transistor 236 may be formed in semiglobal interconnect layer 210 or another interconnect layer.

In additional steps, in some embodiments, additional elements of an integrated circuit device may be formed (1114), such as I/O blocks 104 and/or additional device packaging components. Finally, the integrated circuit device may be attached (1116) to a system board. In some embodiments, integrated circuit device 100 may be soldered to a system board that also includes, among other components, a power supply to power integrated circuit device 100 through the system board.

Figure 12:
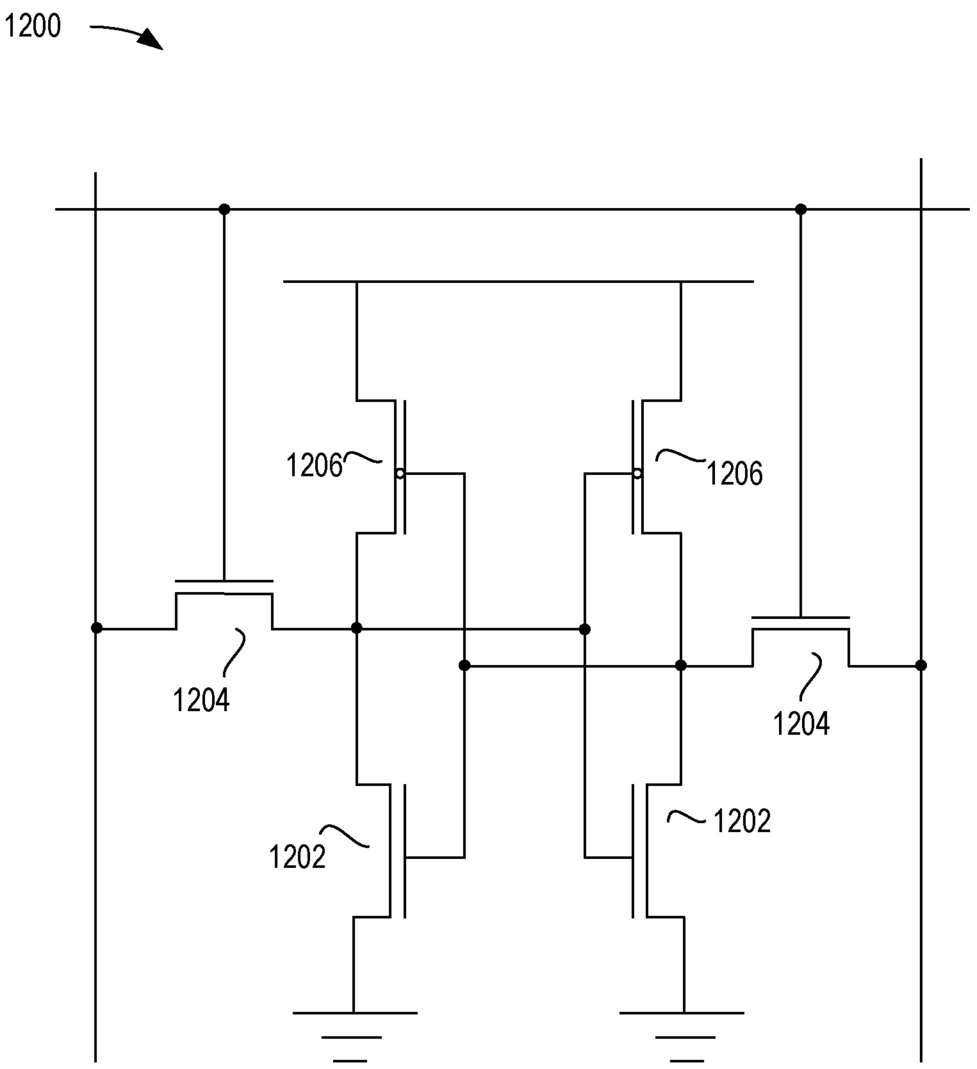
FIG. 12 illustrates a SRAM cell suitable for implementing a reconfigurable architecture using ferroelectrics, in accordance with some embodiments.

FIG. 12 illustrates a SRAM cell suitable for implementing a reconfigurable architecture using ferroelectrics, in accordance with some embodiments. In some embodiments a single transistor with a ferroelectric layer incorporated either in a capacitor connected to the gate or incorporated in on the dielectric of the gate terminal of the transistor can execute functionality of the reconfigurable interconnect or GPGS cell shown in FIG. 12. As shown, cell 1200 represents an example 6 transistor (6T) SRAM cell including access transistors 1204, pull-down transistors 1202, and pull-up transistors 1206. In various examples, access transistors 1204, pull-down transistors 1202, and pull-up transistors 1206 may be implemented in a layout as described above. In some embodiments, SRAM cell 1200 may be integrated into a logic unit, such as logic unit 102, of integrated circuit device 100.

In some embodiments, one or more of access transistors 1204 and pull-down transistors 1202 are NMOS transistors and may include features discussed with respect to NMOS transistors herein and pull-up transistors 1206 are PMOS transistors and may include features discussed with respect to PMOS transistors discussed herein. For example, access transistors 1204 and pull-down transistors 1202 may be implemented in parallel transistor bodies 304 on a first plane (for example on a substrate) and oriented in a first direction. One or more of pull-up transistors 1206 may be implemented in coaxial transistor bodies 308 on a second plane (for example on dielectric 306) and oriented in a second direction (for example orthogonally to the NMOS transistor bodies).

Figure 13:
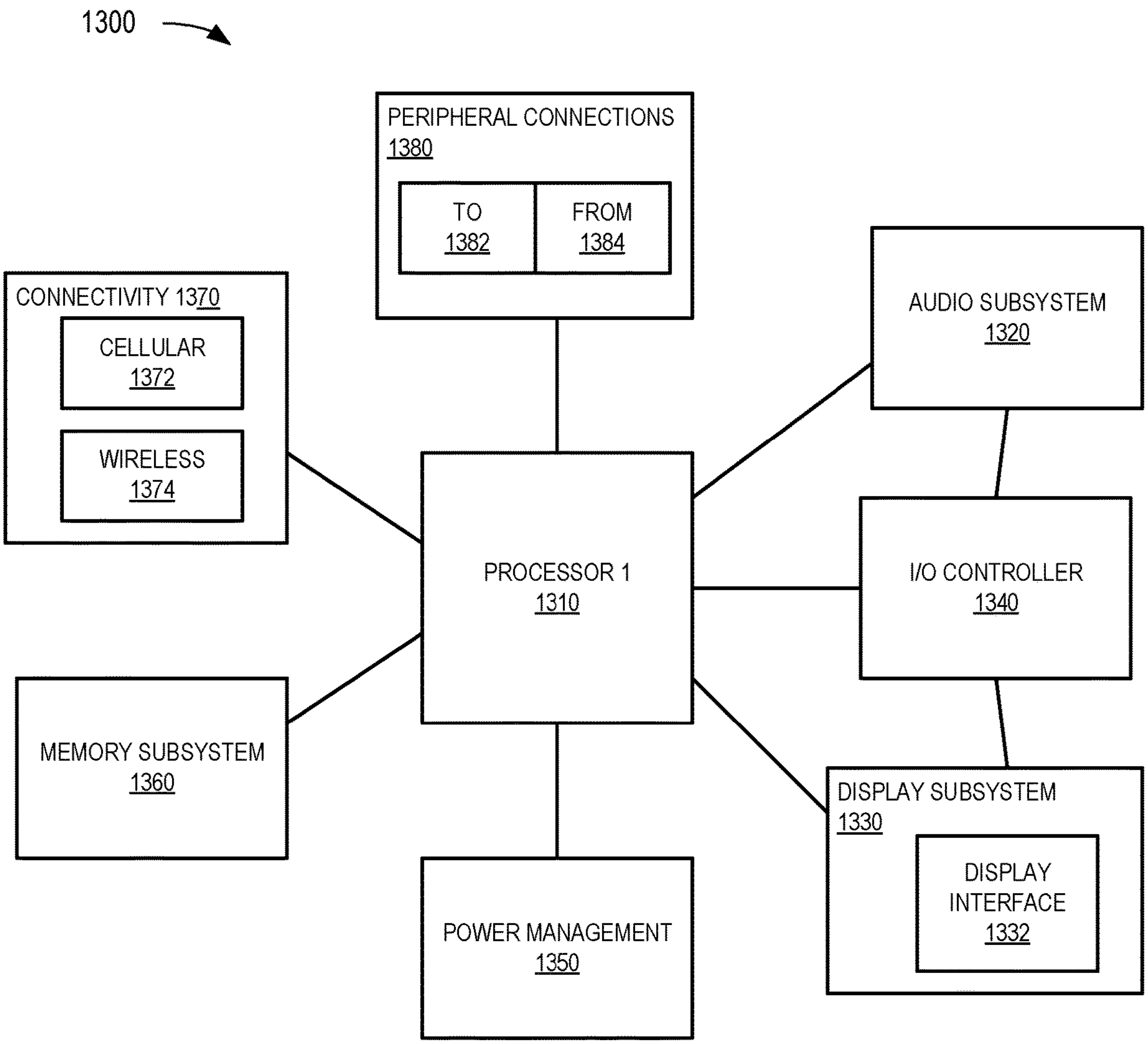
FIG. 13 illustrates a smart device or a computer system or a SoC (System-on-Chip) which includes a semiconductor device with a reconfigurable architecture using ferroelectrics, according to some embodiments.

FIG. 13 illustrates a smart device or a computer system or a SoC (System-on-Chip) 1300 which includes a semiconductor device with a reconfigurable architecture using ferroelectrics, according to some embodiments. In some embodiments, computing device 1300 represents a mobile computing device, such as a computing tablet, a mobile phone or smart-phone, a wireless-enabled e-reader, or other wireless mobile device. It will be understood that certain components are shown generally, and not all components of such a device are shown in computing device 1300. In some embodiments, one or more components of computing device 1300, for example processor 1310 and/or memory subsystem 1360, include a semiconductor device with a reconfigurable architecture using ferroelectrics as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 1300 includes a first processor 1310. The various embodiments of the present disclosure may also comprise a network interface within 1370 such as a wireless interface so that a system embodiment may be incorporated into a wireless device, for example, cell phone or personal digital assistant.

In one embodiment, processor 1310 can include one or more physical devices, such as microprocessors, application processors, microcontrollers, programmable logic devices, or other processing means. The processing operations performed by processor 1310 include the execution of an operating platform or operating system on which applications and/or device functions are executed. The processing operations include operations related to I/O (input/output) with a human user or with other devices, operations related to power management, and/or operations related to connecting the computing device 1300 to another device. The processing operations may also include operations related to audio I/O and/or display I/O.

In one embodiment, computing device 1300 includes audio subsystem 1320, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1300, or connected to the computing device 1300. In one embodiment, a user interacts with the computing device 1300 by providing audio commands that are received and processed by processor 1310.

Display subsystem 1330 represents hardware (e.g., display devices) and software (e.g., drivers) components that provide a visual and/or tactile display for a user to interact with the computing device 1300. Display subsystem 1330 includes display interface 1332, which includes the particular screen or hardware device used to provide a display to a user. In one embodiment, display interface 1332 includes logic separate from processor 1310 to perform at least some processing related to the display. In one embodiment, display subsystem 1330 includes a touch screen (or touch pad) device that provides both output and input to a user.

I/O controller 1340 represents hardware devices and software components related to interaction with a user. I/O controller 1340 is operable to manage hardware that is part of audio subsystem 1320 and/or display subsystem 1330. Additionally, I/O controller 1340 illustrates a connection point for additional devices that connect to computing device 1300 through which a user might interact with the system. For example, devices that can be attached to the computing device 1300 might include microphone devices, speaker or stereo systems, video systems or other display devices, keyboard or keypad devices, or other I/O devices for use with specific applications such as card readers or other devices.

As mentioned above, I/O controller 1340 can interact with audio subsystem 1320 and/or display subsystem 1330. For example, input through a microphone or other audio device can provide input or commands for one or more applications or functions of the computing device 1300. Additionally, audio output can be provided instead of, or in addition to display output. In another example, if display subsystem 1330 includes a touch screen, the display device also acts as an input device, which can be at least partially managed by I/O controller 1340. There can also be additional buttons or switches on the computing device 1300 to provide I/O functions managed by I/O controller 1340.

In one embodiment, I/O controller 1340 manages devices such as accelerometers, cameras, light sensors or other environmental sensors, or other hardware that can be included in the computing device 1300. The input can be part of direct user interaction, as well as providing environmental input to the system to influence its operations (such as filtering for noise, adjusting displays for brightness detection, applying a flash for a camera, or other features).

In one embodiment, computing device 1300 includes power management 1350 that manages battery power usage, charging of the battery, and features related to power saving operation. Memory subsystem 1360 includes memory devices for storing information in computing device 1300. Memory can include nonvolatile (state does not change if power to the memory device is interrupted) and/or volatile (state is indeterminate if power to the memory device is interrupted) memory devices. Memory subsystem 1360 can store application data, user data, music, photos, documents, or other data, as well as system data (whether long-term or temporary) related to the execution of the applications and functions of the computing device 1300.

Elements of embodiments are also provided as a machine-readable medium (e.g., memory 1360) for storing the computer-executable instructions. The machine-readable medium (e.g., memory 1360) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1370 includes hardware devices (e.g., wireless and/or wired connectors and communication hardware) and software components (e.g., drivers, protocol stacks) to enable the computing device 1300 to communicate with external devices. The computing device 1300 could be separate devices, such as other computing devices, wireless access points or base stations, as well as peripherals such as headsets, printers, or other devices.

Connectivity 1370 can include multiple different types of connectivity. To generalize, the computing device 1300 is illustrated with cellular connectivity 1372 and wireless connectivity 1374. Cellular connectivity 1372 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1374 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1380 include hardware interfaces and connectors, as well as software components (e.g., drivers, protocol stacks) to make peripheral connections. It will be understood that the computing device 1300 could both be a peripheral device ("to" 1382) to other computing devices, as well as have peripheral devices ("from" 1384) connected to it. The computing device 1300 commonly has a "docking" connector to connect to other computing devices for purposes such as managing (e.g., downloading and/or uploading, changing, synchronizing) content on computing device 1300. Additionally, a docking connector can allow computing device 1300 to connect to certain peripherals that allow the computing device 1300 to control content output, for example, to audiovisual or other systems.

In addition to a proprietary docking connector or other proprietary connection hardware, the computing device 1300 can make peripheral connections 1380 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:

a plurality of logic blocks comprising transistors on a substrate, the logic blocks to implement logic functions;

a plurality of input/output (I/O) blocks to connect the logic blocks with components external to the apparatus;

a plurality of interconnect layers comprising wires and vias surrounded by interlayer dielectric above the substrate, the wires and vias to conductively couple the plurality of logic blocks and the plurality of I/O blocks;

a plurality of programmable switches to configure connections between the plurality of logic blocks and the plurality of I/O blocks; and a ferroelectric material contacting a metal in a conductive path of a gate of one or more of the transistors, wherein the ferroelectric material comprises ferroelectric material in a ferroelectric capacitor, the ferroelectric material comprises a layer of material between a metal gate and a fin body in a fin field effect transistor (FinFET), the ferroelectric material comprises a ferroelectric material in a thin film transistor formed on the interlayer dielectric such that the thin film transistor is to gate power to one or more of the logic blocks, or the ferroelectric material comprises a layer of material between a metal gate and a channel of a planar transistor.

2. The apparatus of claim 1, wherein the ferroelectric material comprises a ferroelectric fluoride or a perovskite ferroelectric.

3. The apparatus of claim 1, wherein the ferroelectric material comprises the layer of material between the metal gate and the channel of the planar transistor, and the apparatus further comprises a ferroelectric capacitor conductively coupled with the metal gate.

4. The apparatus of claim 1, wherein the logic blocks comprise a static random access memory (SRAM) cell of a field programmable gate array (FPGA).

5. The apparatus of claim 1, wherein the ferroelectric material comprises the ferroelectric material in the ferroelectric capacitor, the ferroelectric capacitor comprising one of a thin film planar capacitor, a vertical capacitor, or a cylinder capacitor.

6. The apparatus of claim 1, further comprising:

a host board; and an integrated circuit device coupled to the host board, the integrated circuit device comprising the plurality of logic blocks, the plurality of I/O blocks, the plurality of interconnect layers, the plurality of programmable switches, and the ferroelectric material.

7. The apparatus of claim 6, further comprising a power supply to provide power to the integrated circuit device through the host board.

8. A field programmable gate array (FPGA) apparatus, comprising:

a plurality of digital circuits comprising transistors on a substrate, the digital circuits to implement logic functions;

a plurality of external interfaces to connect the digital circuits with components external to the FPGA apparatus;

a plurality of interconnect layers comprising wires and vias surrounded by interlayer dielectric above the substrate, the wires and vias to conductively couple the plurality of digital circuits and the plurality of external interfaces;

a plurality of programmable switches to configure connections between the plurality of digital circuits and the plurality of external interfaces; and a ferroelectric material contacting a metal in a conductive path of a gate of one or more of the transistors, wherein the ferroelectric material comprises ferroelectric material in a ferroelectric capacitor, the ferroelectric material comprises a layer of material between a metal gate and a fin body in a fin field effect transistor (FinFET), the ferroelectric material comprises a ferroelectric material in a thin film transistor formed on the interlayer dielectric such that the thin film transistor is to gate power to one or more of the digital circuits, or the ferroelectric material comprises a layer of material between a metal gate and a channel of a planar transistor.

9. The FPGA apparatus of claim 8, wherein the ferroelectric material comprises a ferroelectric fluoride or a perovskite ferroelectric.

10. The FPGA apparatus of claim 8, wherein the ferroelectric material comprises the layer of material between the metal gate and the channel of the planar transistor, and the apparatus further comprises a ferroelectric capacitor conductively coupled with the metal gate.

11. The FPGA apparatus of claim 8, wherein the digital circuits comprise a static random access memory (SRAM) cell of the FPGA apparatus.

12. The FPGA apparatus of claim 8, wherein the ferroelectric material comprises the ferroelectric material in the ferroelectric capacitor, the ferroelectric capacitor comprising one of a thin film planar capacitor, a vertical capacitor, or a cylinder capacitor.

13. The FPGA apparatus of claim 8, further comprising:

a host board; and an integrated circuit device coupled to the host board, the integrated circuit device comprising the plurality of digital circuits, the plurality of external interfaces, the plurality of interconnect layers, the plurality of programmable switches, and the ferroelectric material.

14. The FPGA apparatus of claim 13, further comprising a power supply to provide power to the integrated circuit device through the host board.

15. An apparatus, comprising:

a plurality of logic blocks comprising static random access memory (SRAM) cells comprising transistors on a semiconductor substrate, the logic blocks to implement logic functions;

a plurality of input/output (I/O) blocks connecting the logic blocks with components external to the apparatus;

a plurality of interconnect layers comprising wires and vias surrounded by interlayer dielectric above the semiconductor substrate, the wires and vias to conductively couple the plurality of logic blocks and the plurality of I/O blocks;

a plurality of programmable switches to configure connections between the plurality of logic blocks and the plurality of I/O blocks; and a ferroelectric material contacting a metal in a conductive path of a gate of one or more of the transistors, wherein the ferroelectric material comprises ferroelectric material in a ferroelectric capacitor, the ferroelectric material comprises a layer of material between a metal gate and a fin body in a fin field effect transistor (FinFET), the ferroelectric material comprises a ferroelectric material in a thin film transistor formed on the interlayer dielectric such that the thin film transistor is to gate power to one or more of the logic blocks, or the ferroelectric material comprises a layer of material between a metal gate and a channel of a planar transistor.

16. The apparatus of claim 15, wherein the ferroelectric material comprises a ferroelectric fluoride or a perovskite ferroelectric.

17. The apparatus of claim 15, wherein the ferroelectric material comprises the layer of material between the metal gate and the channel of the planar transistor, and the apparatus further comprises a ferroelectric capacitor conductively coupled with the metal gate.

18. The apparatus of claim 15, wherein the logic blocks comprise SRAM cells of a field programmable gate array (FPGA).

19. The apparatus of claim 15, wherein the ferroelectric material comprises the ferroelectric material in the ferroelectric capacitor, the ferroelectric capacitor comprising one of a thin film planar capacitor, a vertical capacitor, or a cylinder capacitor.

20. The apparatus of claim 15, further comprising:

a host board; and an integrated circuit device coupled to the host board, the integrated circuit device comprising the plurality of logic blocks, the plurality of I/O blocks, the plurality of interconnect layers, the plurality of programmable switches, and the ferroelectric material.

21. The apparatus of claim 20, further comprising a power supply to provide power to the integrated circuit device through the host board.

* * * * *